(12) United States Patent
Ariyoshi et al.

(10) Patent No.: US 10,249,717 B2
(45) Date of Patent: Apr. 2, 2019

(54) SEMICONDUCTOR DEVICE AND METHOD FOR MANUFACTURING THE SAME

(71) Applicants: Kabushiki Kaisha Toshiba, Minato-ku (JP); Fuji Electric Co., Ltd., Kawasaki-shi (JP)

(72) Inventors: Keiko Ariyoshi, Tsukuba (JP); Ryosuke Iijima, Setagaya (JP); Shinya Kyogoku, Tsukuba (JP); Shinsuke Harada, Tsukuba (JP); Yusuke Kobayashi, Nagareyama (JP)

(73) Assignees: Kabushiki Kaisha Toshiba, Minato-ku (JP); Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 15/883,254

(22) Filed: Jan. 30, 2018

(65) Prior Publication Data

US 2018/0219070 A1    Aug. 2, 2018

(30) Foreign Application Priority Data

Jan. 30, 2017    (JP) .................................. 2017-014251

(51) Int. Cl.
*H01L 29/15* (2006.01)
*H01L 31/0312* (2006.01)
(Continued)

(52) U.S. Cl.
CPC ...... *H01L 29/1608* (2013.01); *H01L 29/1095* (2013.01); *H01L 29/66666* (2013.01); *H01L 29/7802* (2013.01)

(58) Field of Classification Search
USPC ......... 257/77, 163–166, 197, 205, 273, 351, 257/361, 378, 423, 427, 474, 477, 517,
(Continued)

(56) References Cited

U.S. PATENT DOCUMENTS 9,178,055 B2    11/2015    Tanaka et al.
2012/0261676 A1    10/2012    Nakano
2015/0035051 A1*    2/2015    Hebert ................ H01L 29/7813
                                                        257/334

FOREIGN PATENT DOCUMENTS

JP    2011-134910    7/2011
JP    2015-070193    4/2015

* cited by examiner

*Primary Examiner* — Niki H Nguyen
(74) *Attorney, Agent, or Firm* — Oblon, McClelland, Maier & Neustadt, L.L.P.

(57) ABSTRACT

According to one embodiment, a semiconductor device includes a first electrode, a second electrode, first to fourth semiconductor regions and a first insulating film. The second electrode includes first, second, and third electrode regions. The first semiconductor region includes first, second, third, fourth, and fifth partial regions. The first partial region is separated from the first electrode. The second partial region is separated from the first electrode region. The fourth partial region is separated from the second electrode region. The second semiconductor region includes sixth, seventh, eighth and ninth partial regions. The third semiconductor region is connected to the second semiconductor region. The fourth semiconductor region is electrically connected to the second electrode. The fourth semiconductor region includes tenth, eleventh, and twelfth partial regions. The first insulating film is provided between the first, third, and fourth semiconductor regions.

18 Claims, 14 Drawing Sheets

(51) Int. Cl.
 *H01L 29/16* (2006.01)
 *H01L 29/10* (2006.01)
 *H01L 29/78* (2006.01)
 *H01L 29/66* (2006.01)

(58) Field of Classification Search
 USPC ............... 257/526, 539, 544, 565–596, 928,
   257/E51.004, E31.069, E27.017,
   257/E27.019–E27.023, E27.037–E27.043,
   257/E27.053–E27.058, E27.074–E27.078,
   257/E27.106, E29.149, E29.03–E29.035,
   257/E29.044–E29.045, E29.114, E29.124,
   257/E29.027–E29.028, E29.066–E29.067,
   257/E29.194–E29.202; 438/170, 186,
   438/202, 309–378
 See application file for complete search history.

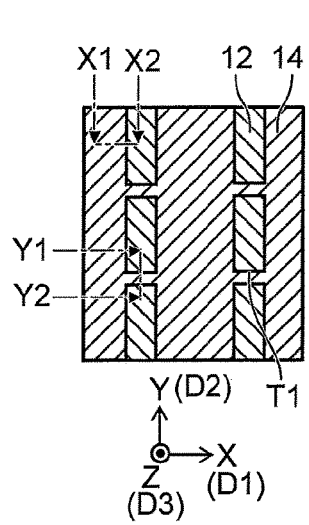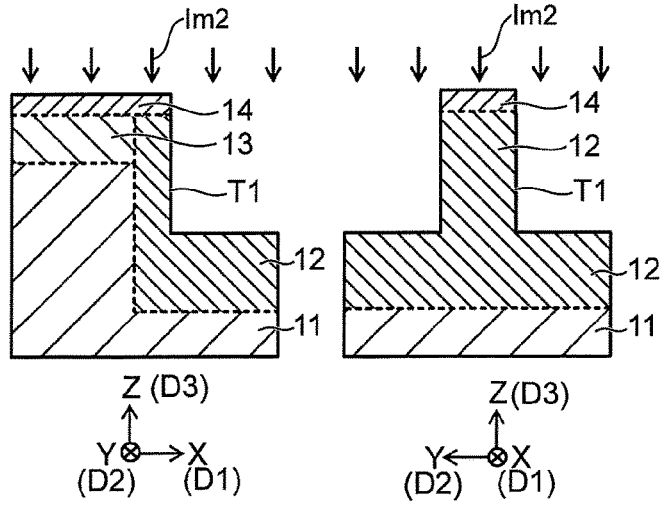
FIG. 11A  FIG. 11B  FIG. 11C
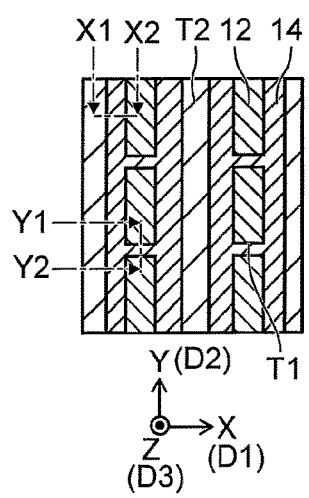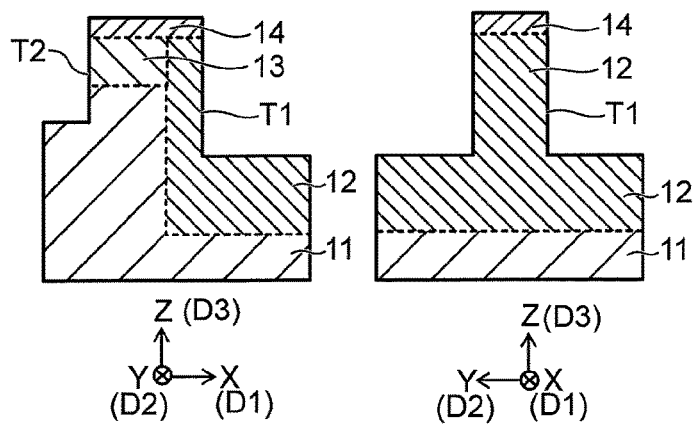
FIG. 12A  FIG. 12B  FIG. 12C

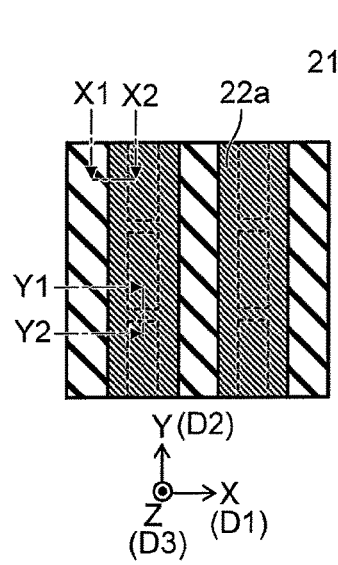 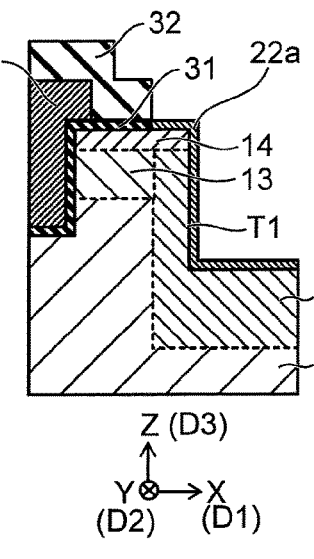 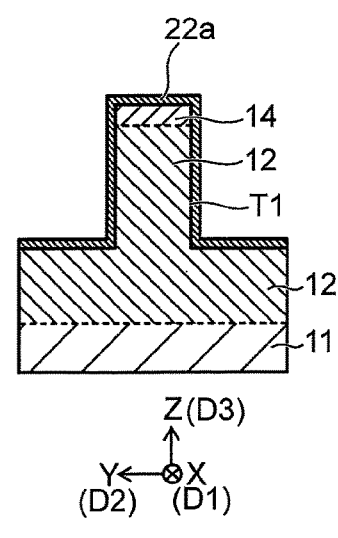
FIG. 15A  FIG. 15B  FIG. 15C
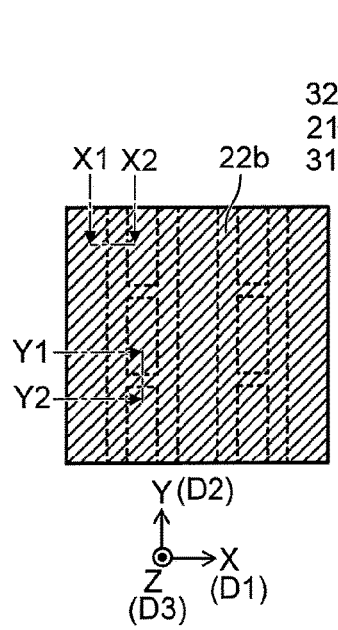 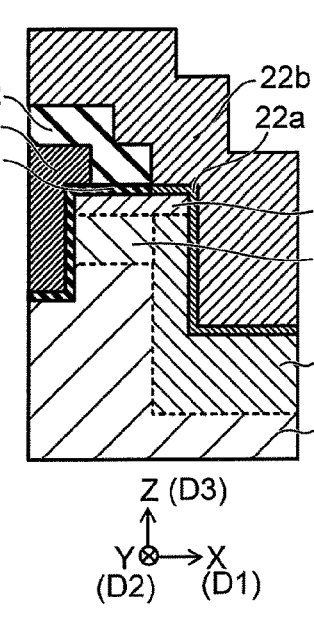 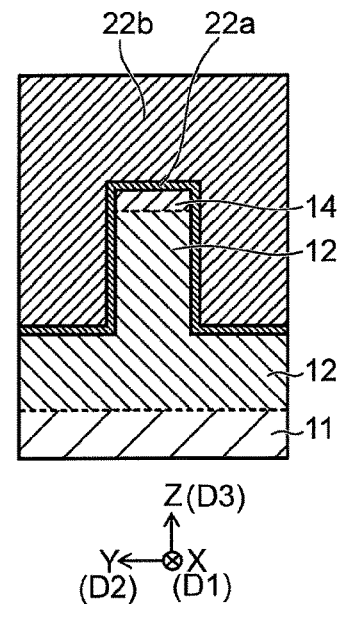
FIG. 16A  FIG. 16B  FIG. 16C

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2017-014251, filed on Jan. 30, 2017; the entire contents of which are incorporated herein by reference.

FIELD

Embodiments described herein relate generally to a semiconductor device and a method for manufacturing the same.

BACKGROUND

It is desirable to reduce the on-resistance of a semiconductor device.

BRIEF DESCRIPTION OF THE DRAWINGS

FIG. 11A to FIG. 11C are schematic views illustrating the method for manufacturing the semiconductor device according to the first embodiment;

FIG. 12A to FIG. 12C are schematic views illustrating the method for manufacturing the semiconductor device according to the first embodiment;

FIG. 15A to FIG. 15C are schematic views illustrating the method for manufacturing the semiconductor device according to the first embodiment;

FIG. 16A to FIG. 16C are schematic views illustrating the method for manufacturing the semiconductor device according to the first embodiment;

DETAILED DESCRIPTION

Figure 1A:
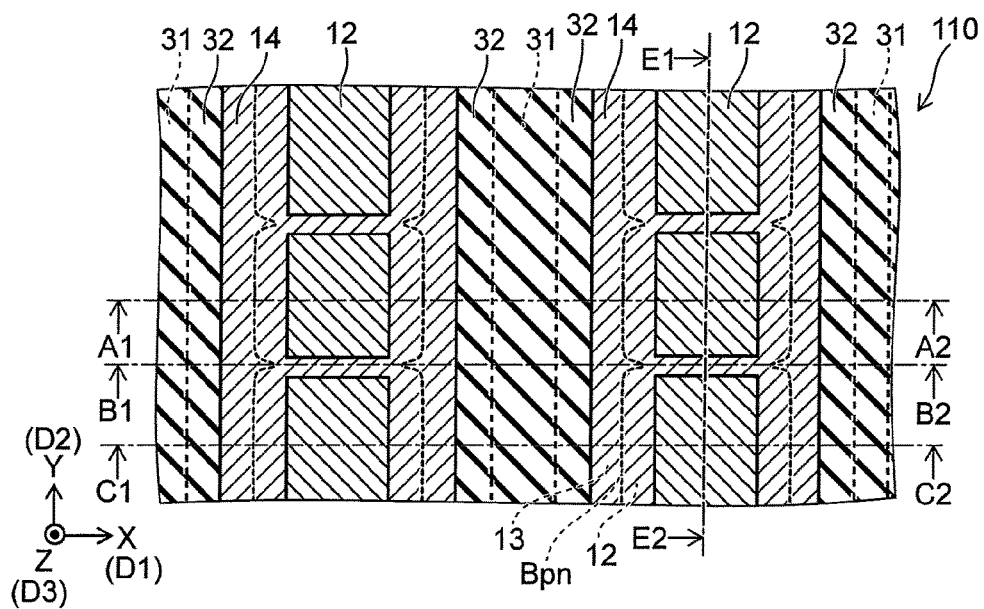
FIG. 1A and FIG. 1B are schematic views illustrating a semiconductor device according to a first embodiment.

According to one embodiment, a semiconductor device includes a first electrode, a second electrode, first to fourth semiconductor regions and a first insulating film. The second electrode includes a first electrode region, a second electrode region, and a third electrode region. A first direction is from the first electrode toward the first electrode region and crosses a second direction. The second direction is from the first electrode region toward the second electrode region. A position of the third electrode region in the first direction is between a position of the first electrode region in the first direction and a position of the first electrode in the first direction. The first semiconductor region is of a first conductivity type. The first semiconductor region includes a first partial region, a second partial region, a third partial region, a fourth partial region, and a fifth partial region. The first partial region is separated from the first electrode in a third direction. The third direction crosses the first direction and the second direction. The second partial region is separated from the first electrode region in the third direction. A position of the third partial region in the first direction is between a position of the first partial region in the first direction and a position of the second partial region in the first direction. At least a portion of the third partial region is between the first electrode and the first electrode region in the first direction. The fourth partial region is separated from the second electrode region in the third direction. The fifth partial region is between the second partial region and the fourth partial region. The second semiconductor region is of a second conductivity type. The second semiconductor region includes a sixth partial region, a seventh partial region, an eighth partial region, and a ninth partial region. The sixth partial region is positioned between the second partial region and the first electrode region in the third direction. A portion of the seventh partial region is positioned between the first electrode region and the at least a portion of the third partial region in the first direction. The eighth partial region is positioned between the fourth partial region and the second electrode region in the third direction. At least a portion of the ninth partial region is positioned between the first electrode region and the second electrode region in the second direction. The third semiconductor region is of the second conductivity type. The third semiconductor region is connected to the second semiconductor region. The third semiconductor region is positioned between the third electrode region and the at least a portion of the third partial region in the third direction. The third semiconductor region is positioned between the first electrode and another portion of the seventh partial region in the first direction. The fourth semiconductor region is of the first conductivity type. The fourth semiconductor region is electrically connected to the second electrode. The fourth semiconductor region includes a tenth partial region, an eleventh partial region, and a twelfth partial region. The tenth partial region is positioned between the third semiconductor region and a portion of the third electrode region in the third direction. The eleventh partial region is positioned between the seventh partial region and another portion of the third electrode region in the third direction. The twelfth partial region is positioned between the ninth partial region and the second electrode in the third direction. The first insulating film is provided between the first electrode and the first semiconductor region, between the first electrode and the third semiconductor region, and between the first electrode and the fourth semiconductor region.

First Embodiment

Figure 1B:
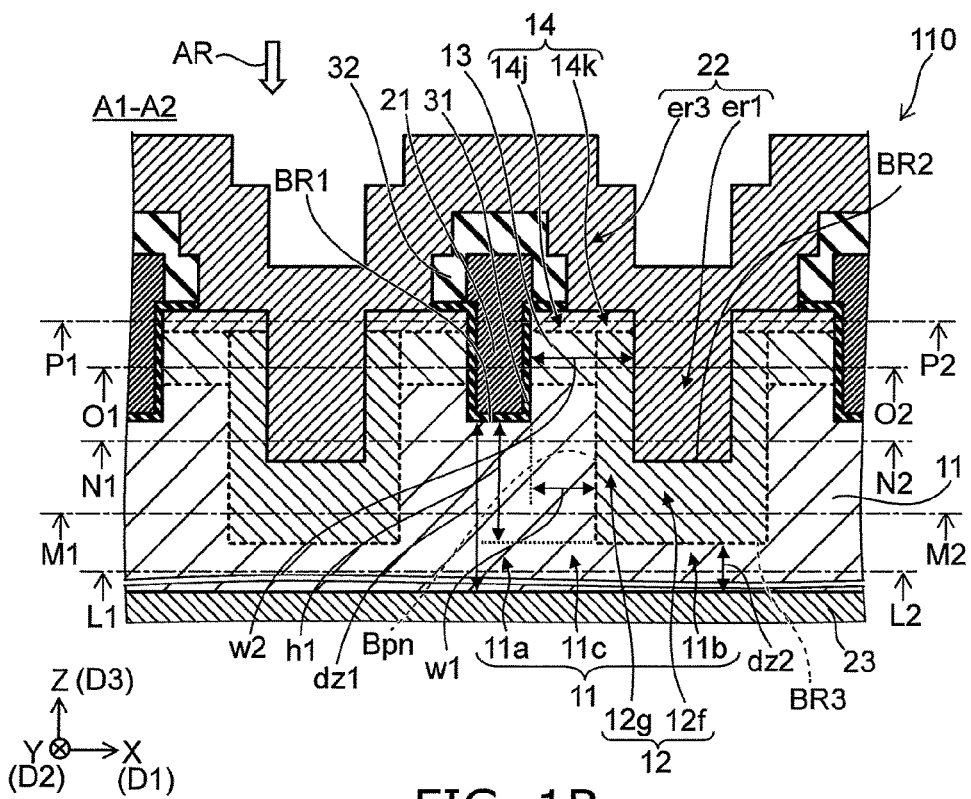

FIG. 1A and FIG. 1B are schematic views illustrating a semiconductor device according to a first embodiment.

Figure 2A:
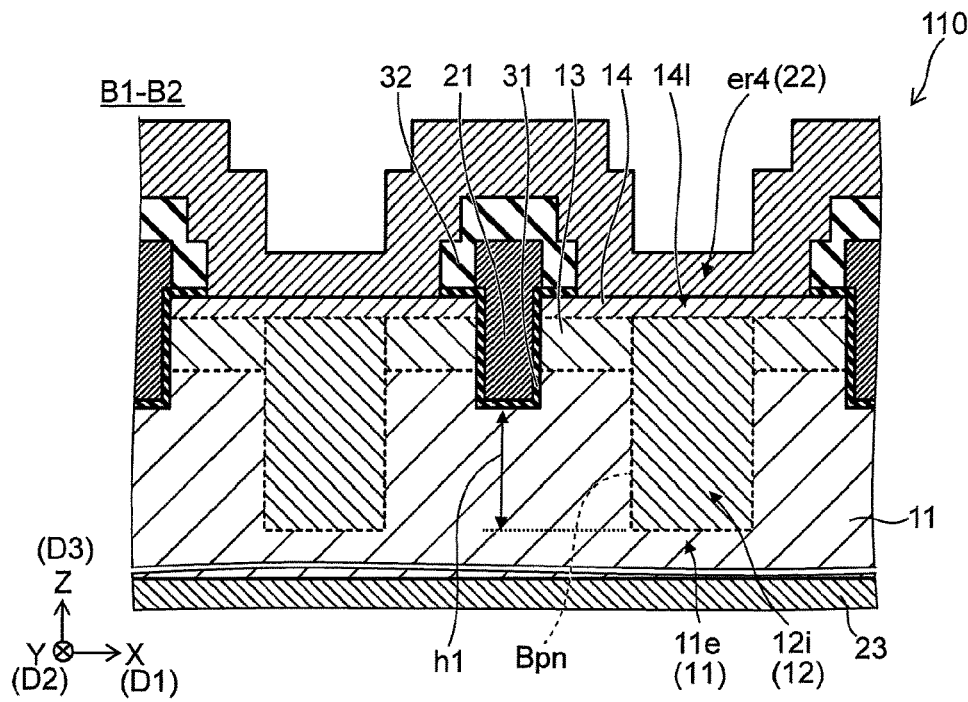
FIG. 2A and FIG. 2B are schematic cross-sectional views illustrating the semiconductor device according to the first embodiment.
Figure 2B:
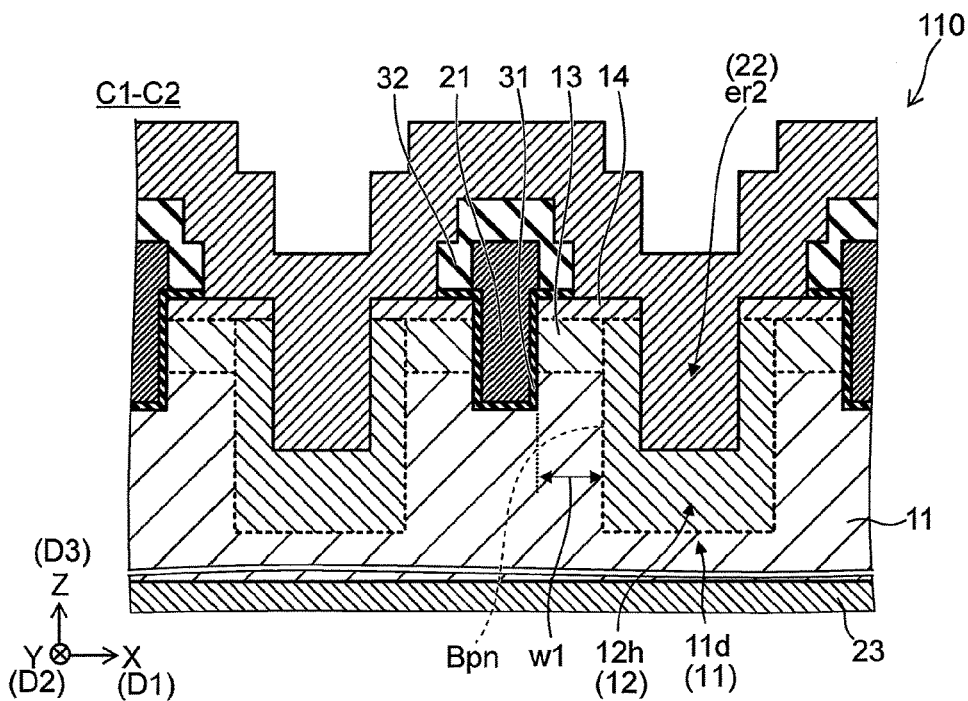

FIG. 2A and FIG. 2B are schematic cross-sectional views illustrating the semiconductor device according to the first embodiment.

Figure 3:
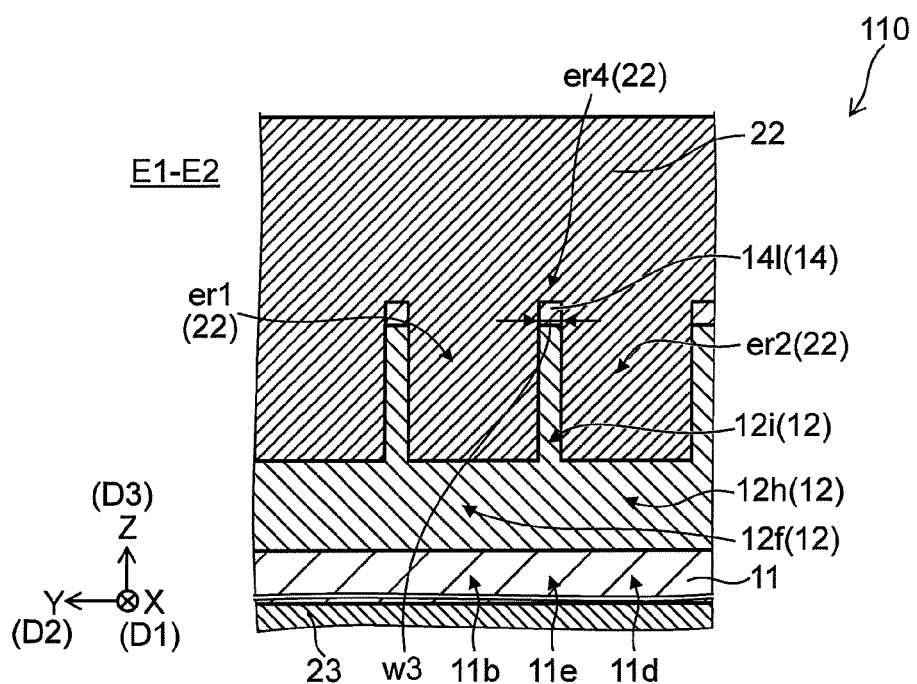
FIG. 3 is a schematic cross-sectional view illustrating the semiconductor device according to the first embodiment.

FIG. 3 is a schematic cross-sectional view illustrating the semiconductor device according to the first embodiment.

Figure 4A:
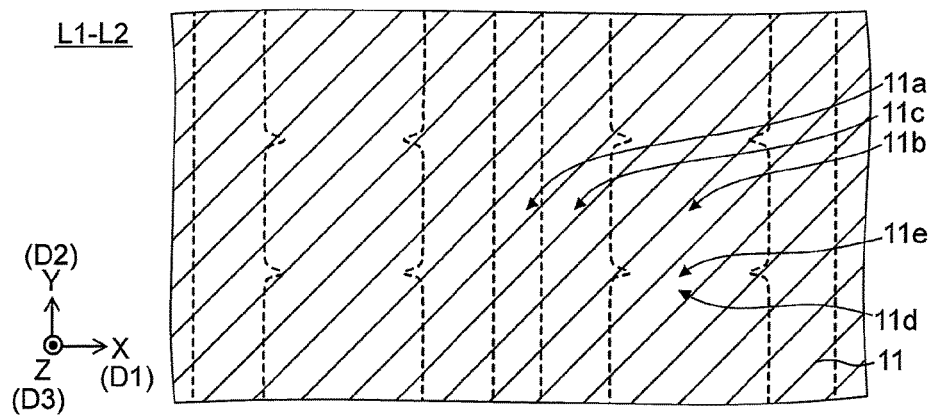
FIG. 4A to FIG. 4C are schematic cross-sectional views illustrating the semiconductor device according to the first embodiment.
Figure 4B:
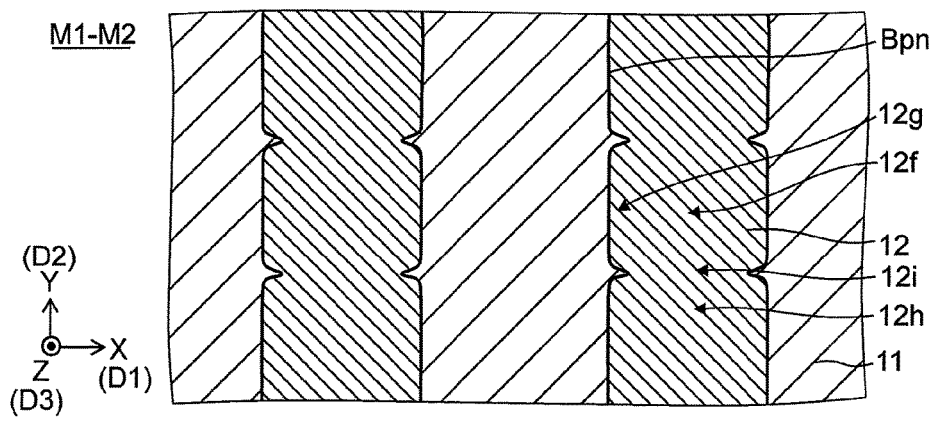
Figure 4C:
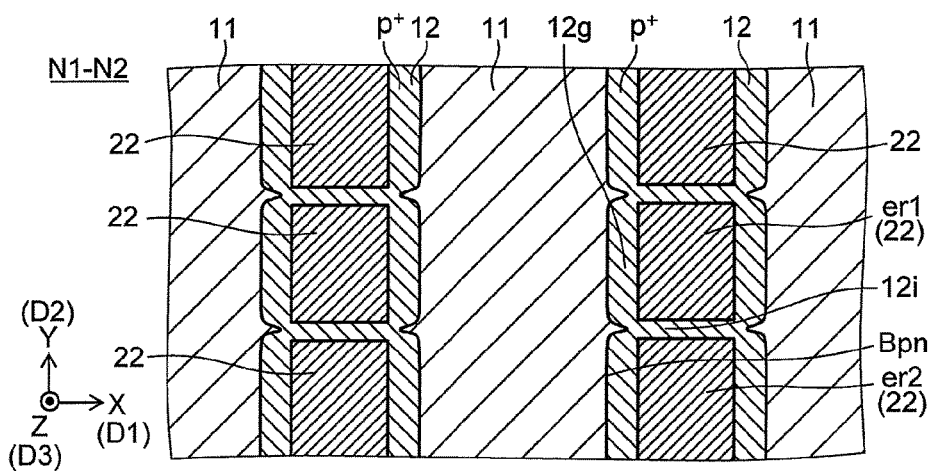

FIG. 4A to FIG. 4C are schematic cross-sectional views illustrating the semiconductor device according to the first embodiment.

Figure 5A:
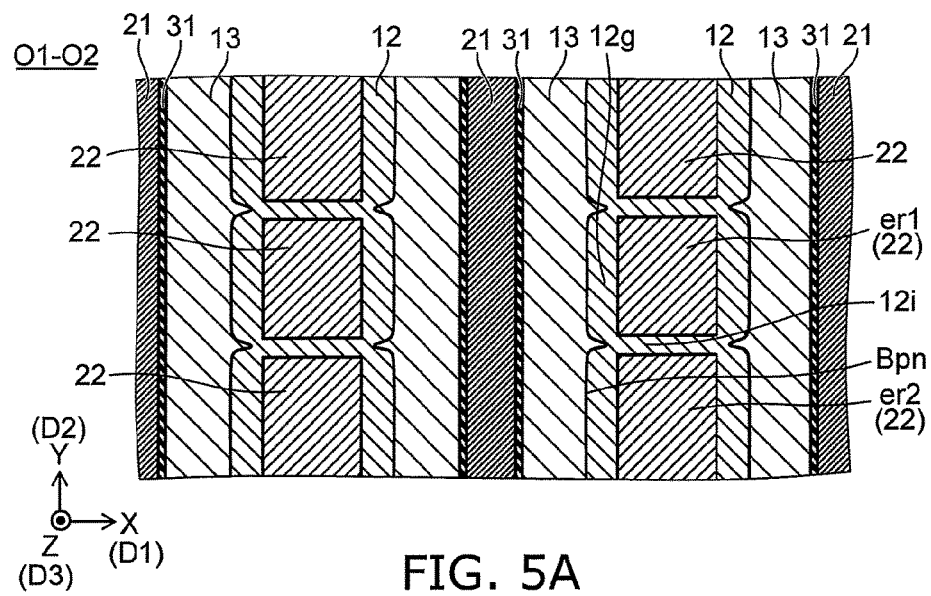
FIG. 5A and FIG. 5B are schematic cross-sectional views illustrating the semiconductor device according to the first embodiment.
Figure 5B:
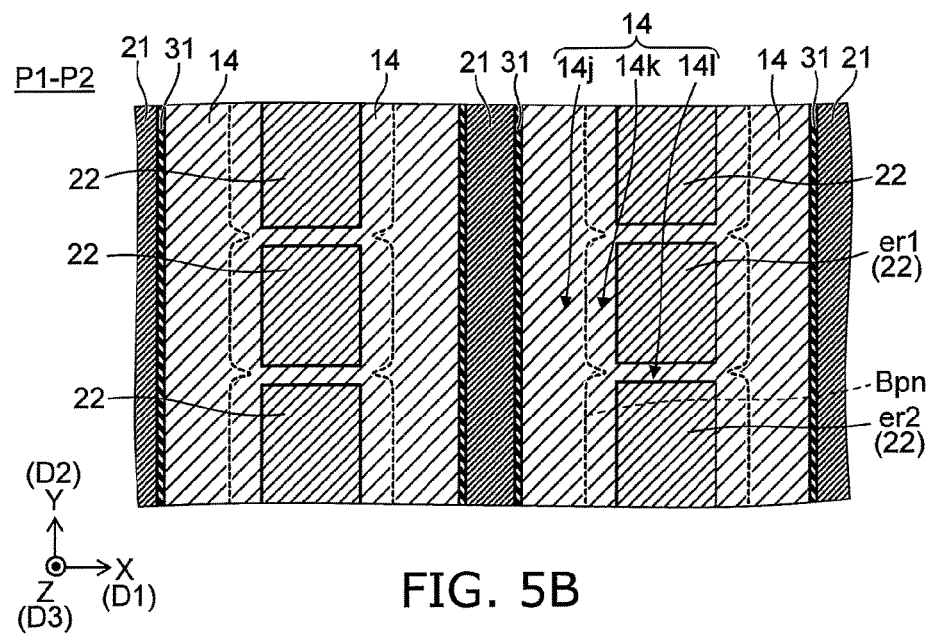

FIG. 5A and FIG. 5B are schematic cross-sectional views illustrating the semiconductor device according to the first embodiment.

FIG. 1A is a schematic see-through plan view. FIG. 1A corresponds to a plan view as viewed along arrow AR of FIG. 1B. FIG. 1B, FIG. 2A, FIG. 2B, and FIG. 3 respectively are cross-sectional views along line A1-A2, line B1-B2, line C1-C2, and line E1-E2 of FIG. 1A. FIG. 4A to FIG. 4C, FIG. 5A, and FIG. 5B respectively are cross-sectional views along line L1-L2, line M1-M2, line N1-N2, line O1-O2, and line P1-P2 of FIG. 1B. As shown in these drawings, the semiconductor device 110 according to the embodiment includes a first electrode 21, a second electrode 22, first to fourth semiconductor regions 11 to 14, and a first insulating film 31. A second insulating film 32 and a third electrode 23 are further provided in the example. As shown in FIG. 1B and FIG. 2B, the second electrode 22 includes a first electrode region er1, a second electrode region er2, and a third electrode region er3. As described below, other electrode regions may be further provided in the second electrode 22.

A first direction D1 from the first electrode 21 toward the first electrode region er1 crosses a second direction D2 from the first electrode region er1 toward the second electrode region er2.

The first direction D1 is, for example, an X-axis direction. One direction perpendicular to the X-axis direction is taken as a Y-axis direction. A direction perpendicular to the X-axis direction and the Y-axis direction is taken as a Z-axis direction.

In the example, the second direction D2 is the Y-axis direction.

As shown in FIG. 1B, the position of the third electrode region er3 in the first direction D1 (the X-axis direction) is between the position of the first electrode region er1 in the first direction D1 and the position of the first electrode 21 in the first direction D1.

As shown in FIG. 3, the second electrode region er2 is continuous with the first electrode region er1. For example, the second electrode region er2 is linked to the first electrode region er1 by a fourth electrode region er4. The second electrode region er2 is electrically connected to the first electrode region er1.

The first semiconductor region 11 is of a first conductivity type. The first semiconductor region 11 includes a first partial region 11a, a second partial region 11b, a third partial region 11c, a fourth partial region 11d, and a fifth partial region 11e.

The first partial region 11a is separated from the first electrode 21 in a third direction D3. The third direction D3 crosses the first direction D1 and the second direction D2. In the example, the third direction D3 is the Z-axis direction. The second partial region 11b is separated from the first electrode region er1 in the third direction D3 (the Z-axis direction).

The position of the third partial region 11c in the first direction D1 (the X-axis direction) is between the position of the first partial region 11a in the first direction D1 and the position of the second partial region 11b in the first direction D1. At least a portion of the third partial region 11c is between the first electrode 21 and the first electrode region er1 in the first direction D1 (the X-axis direction).

As shown in FIG. 2B, the fourth partial region 11d is separated from the second electrode region er2 in the third direction D3 (the Z-axis direction).

As shown in FIG. 3, the fifth partial region 11e is between the second partial region 11b and the fourth partial region 11d in the second direction D2.

A second semiconductor region 12 is of a second conductivity type.

The first conductivity type is an n-type; and the second conductivity type is a p-type. The first conductivity type may be the p-type; and the second conductivity type may be the n-type. Hereinbelow, the first conductivity type is taken to be the n-type; and the second conductivity type is taken to be the p-type.

The second semiconductor region 12 includes a sixth partial region 12f, a seventh partial region 12g, an eighth partial region 12h, and a ninth partial region 12i.

As shown in FIG. 1B and FIG. 3, the sixth partial region 12f is positioned between the second partial region 11b and the first electrode region er1 in the third direction D3 (the Z-axis direction).

A portion (in FIG. 1B, the lower portion) of the seventh partial region 12g is positioned between the first electrode region er1 and the at least a portion of the third partial region 11c recited above in the first direction D1 (the X-axis direction).

As shown in FIG. 2B and FIG. 3, the eighth partial region 12h is positioned between the fourth partial region 11d and the second electrode region er2 in the third direction D3 (the Z-axis direction).

As shown in FIG. 3, at least a portion of the ninth partial region 12i is positioned between the first electrode region er1 and the second electrode region er2 in the second direction D2 (the Y-axis direction).

In the example as shown in FIG. 3, the ninth partial region 12i contacts the first electrode region er1 in the second direction D2. The ninth partial region 12i contacts the second electrode region er2 in the second direction D2.

In the example as shown in FIG. 3, the fourth electrode region er4 is provided in the second electrode 22. The position of the fourth electrode region er4 in the second direction D2 (the Y-axis direction) is positioned between the position of the first electrode region er1 in the second direction D2 and the position of the second electrode region er2 in the second direction D2. The ninth partial region 12i is positioned between the fourth electrode region er4 and the fifth partial region 11e in the third direction D3 (the Z-axis direction).

As shown in FIG. 1B, a third semiconductor region 13 is connected to the second semiconductor region 12. The third semiconductor region 13 is of the second conductivity type (in the example, the p-type). The third semiconductor region 13 is positioned between the third electrode region er3 and the at least a portion of the third partial region 11c recited above in the third direction D3 (the Z-axis direction). The third semiconductor region 13 is positioned between the first electrode 21 and another portion (in FIG. 1B, the upper portion) of the seventh partial region 12g in the first direction D1 (the X-axis direction).

The fourth semiconductor region 14 is electrically connected to the second electrode 22. The fourth semiconductor region 14 is of the first conductivity type (in the example, the n-type). The fourth semiconductor region 14 includes a tenth partial region 14j, an eleventh partial region 14k, and a twelfth partial region 14l.

As shown in FIG. 1B, the tenth partial region 14j is positioned between the third semiconductor region 13 and a portion of the third electrode region er3 in the third direction D3 (the Z-axis direction).

As shown in FIG. 1B and FIG. 5B, the tenth partial region 14j is positioned between the first electrode 21 and the first electrode region er1 in the first direction D1 (the X-axis direction).

As shown in FIG. 1B, the eleventh partial region 14k is positioned between the seventh partial region 12g and another portion of the third electrode region er3 in the third direction D3 (the Z-axis direction).

As shown in FIG. 1B and FIG. 5B, the eleventh partial region 14k is positioned between the tenth partial region 14j and the first electrode region er1 in the first direction D1 (the X-axis direction).

As shown in FIG. 3, the twelfth partial region 14l is positioned between the ninth partial region 12i and the second electrode 22 in the third direction D3 (the Z-axis direction).

As shown in FIG. 3 and FIG. 5B, for example, the twelfth partial region 14l is positioned between the first electrode region er1 and the second electrode region er2 in the second direction D2 (the Y-axis direction). For example, the twelfth partial region 14l contacts the first electrode region er1 in the second direction D2 (the Y-axis direction). For example, the twelfth partial region 14l contacts the second electrode region er2 in the second direction D2 (the Y-axis direction).

As shown in FIG. 3, the twelfth partial region 14l is positioned between the ninth partial region 12i and the fourth electrode region er4 in the third direction D3 (the Z-axis direction).

As shown in FIG. 1B, the first insulating film 31 is provided between the first electrode 21 and the first semiconductor region 11, between the first electrode 21 and the third semiconductor region 13, and between the first electrode 21 and the fourth semiconductor region 14.

As shown in FIG. 1B, the first semiconductor region 11 is positioned between the third electrode 23 and the first electrode 21 in the third direction D3 (the Z-axis direction) and between the third electrode 23 and the second electrode 22 in the third direction D3. Also, the other semiconductor regions are positioned between the third electrode 23 and the second electrode 22 in the third direction D3.

In the example as shown in FIG. 1B, the second electrode 22 further includes a portion overlapping the first electrode 21 in the third direction D3 (the Z-axis direction). The second insulating film 32 is further provided in the example. The second insulating film 32 is positioned between the first electrode 21 and the portion (the overlapping portion) of the second electrode 22 recited above in the third direction D3. The second insulating film 32 electrically isolates the first electrode 21 and the second electrode 22 from each other.

The first electrode 21 functions as, for example, a gate electrode. The first insulating film 31 functions as, for example, a gate insulating film. The second electrode 22 functions as, for example, a source electrode. The third electrode 23 functions as, for example, a drain electrode.

For example, the current that flows between the second electrode 22 and the third electrode 23 is controlled according to the potential of the first electrode 21. For example, the fourth semiconductor region 14, the third semiconductor region 13, and the first semiconductor region 11 are used as a channel.

As shown in FIG. 5A and FIG. 5B, the first electrode 21 extends along the second direction D2 (the Y-axis direction). The second electrode region erg is separated from the first electrode 21 in the first direction D1 (the X-axis direction). The first electrode 21 is, for example, a trench gate electrode.

The semiconductor device 110 is, for example, a vertical MOSFET (metal-oxide-semiconductor field-effect transistor).

In the semiconductor device 110, for example, the surface area of the channel per unit surface area can be increased by the structure of the trench gate electrode. A low on-resistance is obtained.

In the embodiment, for example, the fourth semiconductor region 14 is used as a contact region for the second electrode 22. In the embodiment, the fourth semiconductor region 14 includes the tenth partial region 14j and the eleventh partial region 14k. As shown in FIG. 1B and FIG. 5B, these partial regions are arranged with the first electrode region er1 in the first direction D1 (the X-axis direction). Electrical contact with the second electrode 22 is obtained in these partial regions.

In the embodiment, the twelfth partial region 14l is provided in the fourth semiconductor region 14 in addition to the tenth partial region 14j and the eleventh partial region 14k. As shown in FIG. 3 and FIG. 5B, the twelfth partial region 14l is arranged with the first electrode region er1 (and the second electrode region er2) in the second direction D2 (the Y-axis direction). The twelfth partial region 14l also functions as a contact region with the second electrode 22. By providing the twelfth partial region 14l, the contact region can be enlarged. Thereby, the on-resistance can be reduced.

According to the embodiment, a semiconductor device can be provided in which the on-resistance can be reduced.

For example, the first semiconductor region 11, the second semiconductor region 12, the third semiconductor region 13, and the fourth semiconductor region 14 include silicon carbide (SIC). Thereby, a high breakdown voltage is obtained. These semiconductor regions may include, for example, Al, N, P, As, etc.

In such a case, in the embodiment, at least a portion (the first electrode region er1, the second electrode region er2, etc., recited above) of the second electrode 22 overlaps the first electrode 21 in the first direction D1 (the X-axis direction). The second semiconductor region 12 is provided under this portion of the second electrode 22. Thereby, for example, the electric field that is applied to the first insulating film 31 is relaxed. For example, a depletion layer extends toward the first insulating film 31 from the second semiconductor region 12 under the first electrode region er1. Thereby, for example, the electric field that is applied to the first insulating film 31 is relaxed. Thereby, high reliability is obtained.

For example, the relaxation effect of the electric field is increased by setting the impurity concentration of the second conductivity type in the second semiconductor region 12 to be high.

For example, the difference between a first concentration of an impurity of the second conductivity type in the second semiconductor region 12 and a second concentration of an impurity of the first conductivity type in the second semiconductor region 12 is larger than the difference between a third concentration of the impurity of the second conductivity type in the third semiconductor region 13 and a fourth concentration of the impurity of the first conductivity type in the third semiconductor region 13. For example, the first concentration is higher than the second concentration. The third concentration is higher than the fourth concentration.

On the other hand, for example, the difference between a fifth concentration of an impurity of the first conductivity type in the fourth semiconductor region 14 and a sixth concentration of an impurity of the second conductivity type in the fourth semiconductor region 14 is larger than the difference between a seventh concentration of the impurity of the first conductivity type in the first semiconductor region 11 and an eighth concentration of the impurity of the second conductivity type in the first semiconductor region 11. For example, the fifth concentration is higher than the sixth concentration. The seventh concentration is higher than the eighth concentration.

By setting the impurity concentration of the first conductivity type in the fourth semiconductor region 14 to be high, for example, a low contact resistance is obtained between the second electrode 22 and the fourth semiconductor region 14.

In the embodiment, the first semiconductor region 11 is, for example, an n-layer. The second semiconductor region 12 is, for example, a $p^+$-layer. The third semiconductor region 13 is, for example, a p-layer. The fourth semiconductor region 14 is an $n^+$-layer.

In the case where the semiconductor region includes SiC, the impurity of the first conductivity type includes, for example, at least one selected from the group consisting of nitrogen (N), phosphorus (P), and arsenic (As). The impurity of the second conductivity type includes, for example, at least one selected from the group consisting of aluminum (Al), boron (B), and germanium (Ge).

As shown in FIG. 1B, the lower end of the second semiconductor region 12 is positioned lower than the lower end of the first insulating film 31. Thereby, for example, the electric field that is applied to the first insulating film 31 can be relaxed effectively.

As shown in FIG. 1B, for example, the position in the third direction D3 (the Z-axis direction) of a boundary BR2 between the first electrode region er1 and the sixth partial region 12f of the second semiconductor region 12 is positioned between the position in the third direction D3 of the second partial region 11b of the first semiconductor region 11 and the position in the third direction D3 of a boundary BR1 between the first partial region 11a and the first insulating film 31.

For example, the boundary BR2 is lower than the boundary BR1. The sixth partial region 12f is even lower than the boundary BR2. The second partial region 11b is even lower than the sixth partial region 12f.

As shown in FIG. 1B, at least a portion of the sixth partial region 12f does not overlap the first insulating film 31 in the first direction D1 (the X-axis direction).

As shown in FIG. 1B, a distance dz2 along the third direction D3 between the third electrode 23 and the sixth partial region 12f is shorter than a distance dz1 along the third direction D3 between the third electrode 23 and the first insulating film 31.

By such a configuration, for example, the electric field that is applied to the first insulating film 31 can be relaxed effectively.

As shown in FIG. 1B, a boundary Bpn may be defined between the third partial region 11c of the first semiconductor region 11 and the seventh partial region 12g of the second semiconductor region. The boundary Bpn corresponds to the boundary between the region of the first conductivity type and the region of the second conductivity type. At the boundary Bpn, for example, the impurity concentration of the first conductivity type is substantially the same as the impurity concentration of the second conductivity type.

For example, the distance along the first direction D1 between the first insulating film 31 and the boundary Bpn is taken as a first width w1. In the embodiment, the first width w1 is, for example, not less than 0.2 μm and not more than 2.5 μm.

For example, the distance along the first direction D1 between the first electrode region er1 and the first insulating film 31 is taken as a second width w2. The second width w2 is, for example, not less than 0.5 μm and not more than 3 μm.

For example, the distance along the third direction D3 between a boundary BR3 and the boundary BR1 is taken as a height h1, where the boundary BR3 is between the second partial region 11b of the first semiconductor region 11 and the sixth partial region 12f of the second semiconductor region 12, and the boundary BR1 is between the first insulating film 31 and the first partial region 11a. The height h1 is, for example, not less than 0.5 μm and not more than 3 μm.

As shown in FIG. 3, the distance along the second direction D2 between the first electrode region er1 and the second electrode region er2 is taken as a third width w3. The third width w3 is, for example, not less than 0.5 μm and not more than 2 μm. The third width w3 is, for example, about 1 μm. For example, the third width w3 corresponds to the length along the second direction D2 of the twelfth partial region 14l. For example, the third width w3 corresponds to the length along the second direction D2 of the ninth partial region 12i.

In the example as shown in FIG. 3 and FIG. 5B, the first electrode region er1 does not overlap the twelfth partial region 14l in the third direction D3. The second electrode region er2 does not overlap the twelfth partial region 14l in the third direction D3. In the example, these electrode regions are separated by the twelfth partial region 14l and the ninth partial region 12i. As described below, at least a portion of these electrode regions may be linked.

As shown in FIG. 4A, the first partial region 11a corresponds to at least a portion of a region having a band configuration where the first electrode 21 is provided. In the example, the second partial region 11b, the fifth partial region 11e, and the fourth partial region 11d correspond to regions having band configurations where the first electrode region er1, the second electrode region er2, etc., of the second electrode 22 are provided.

In the example as shown in FIG. 4B, the second semiconductor region 12 has a band configuration along the second direction D2.

In the example as shown in FIG. 4C, the first electrode region er1, the second electrode region er2, etc., are provided to be separated from each other inside the second semiconductor region 12 having the band configuration.

As shown in FIG. 5A, the first electrode 21 has a band configuration along the second direction D2.

As shown in FIG. 5A and FIG. 1B, for example, the first electrode 21 extends along the second direction D2 and the third direction D3. The second direction D2 and the third direction D3 are aligned with the m-plane of the semiconductor region (e.g., the first semiconductor region 11). For example, the first direction D1 (the X-axis direction) may be substantially perpendicular to the ni-plane. For example, the first direction D1 may be of substantially aligned with the a-plane.

As shown in FIG. 5B, the boundary Bpn is recessed partially at a portion corresponding to the twelfth partial region 14*l*. For example, such a configuration can be formed by a manufacturing method including oblique implantation, etc., described below.

Figure 6A:
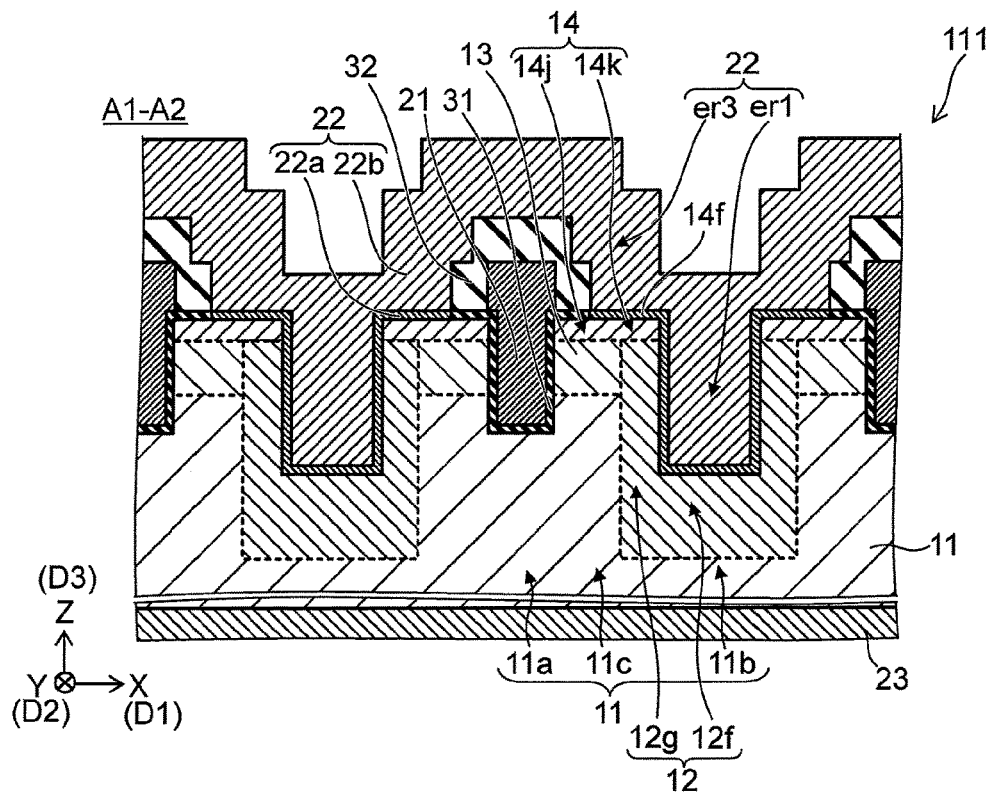
FIG. 6A and FIG. 6B are schematic views illustrating another semiconductor device according to the first embodiment.
Figure 6B:
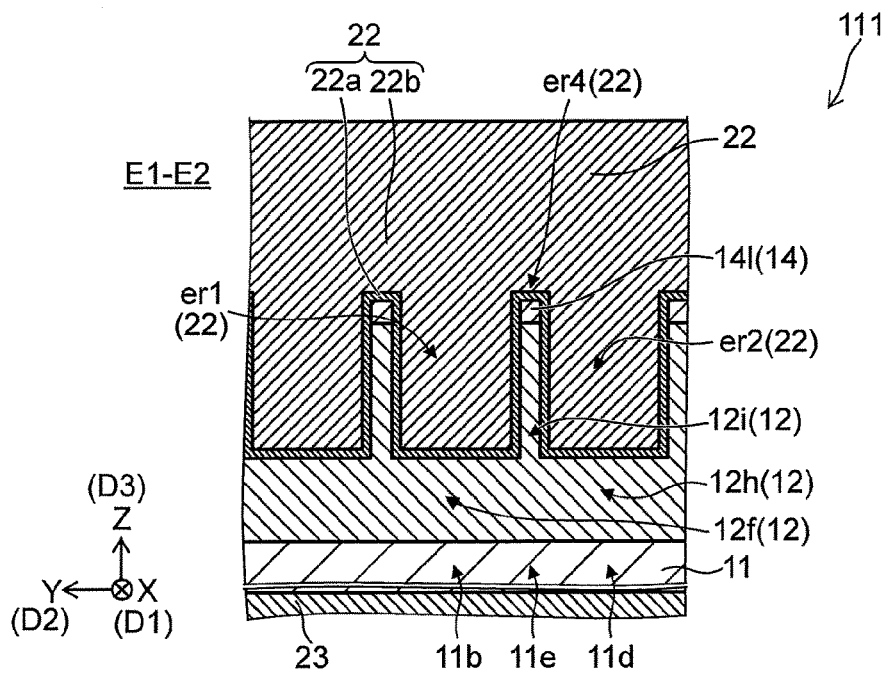

FIG. 6A and FIG. 6B are schematic views illustrating another semiconductor device according to the first embodiment.

FIG. 6A and FIG. 6B are cross-sectional views corresponding respectively to the line A1-A2 and line E1-E2 cross sections of FIG. 1A.

In the other semiconductor device 111 according to the embodiment as shown in these drawings, the second electrode 22 includes multiple conductive films (a first conductive film 22*a*, a second conductive film 22*b*, etc.). For example, the first conductive film 22*a* is provided between the second conductive film 22*b* and the fourth semiconductor region 14. Otherwise, the semiconductor device 111 is similar to the semiconductor device 110.

The first conductive film 22*a* includes, for example, at least one selected from the group consisting of Al and Ni. The first conductive film 22*a* is, for example, a contact metal film.

The second conductive film 22*b* includes, for example, at least one selected from the group consisting of Al and Ti. For example, at least a portion of a bonding pad may be formed of the second conductive film 22*b*.

Other conductive films may be further provided in the second electrode 22. These conductive films are stacked.

An example of a method for manufacturing the semiconductor device according to the embodiment will now be described. The following example corresponds to an example of the method for manufacturing the semiconductor device 111.

FIG. 7A to FIG. 7C, FIG. 8A to FIG. 8C, FIG. 9A to FIG. 9C, FIG. 10A to FIG. 10C, FIG. 11A to FIG. 11C, FIG. 12A to FIG. 12C, FIG. 13A to FIG. 13C, FIG. 14A to FIG. 14C, FIG. 15A to FIG. 15C, and FIG. 16A to FIG. 16C are schematic views illustrating the method for manufacturing the semiconductor device according to the first embodiment.

FIG. 7A, FIG. 8A, FIG. 9A, FIG. 10A, FIG. 11A, FIG. 12A, FIG. 13A, FIG. 14A, FIG. 15A, and FIG. 16A are see-through plan views. FIG. 7B, FIG. 8B, FIG. 9B, FIG. 10B, FIG. 11B, FIG. 12B, FIG. 13B, FIG. 14B, FIG. 15B, and FIG. 16B are cross-sectional views corresponding respectively to line X1-X2 of FIG. 7A, FIG. 8A, FIG. 9A, FIG. 10A, FIG. 11A, FIG. 12A, FIG. 13A, FIG. 14A, FIG. 15A, and FIG. 16A. FIG. 7C, FIG. 8C, FIG. 9C, FIG. 10C, FIG. 11C, FIG. 12C, FIG. 13C, FIG. 14C, FIG. 15C, and FIG. 16C are cross-sectional views corresponding respectively to line Y1-Y2 of FIG. 7A, FIG. 8A, FIG. 9A, FIG. 10A, FIG. 11A, FIG. 12A, FIG. 13A, FIG. 14A, FIG. 15A, and FIG. 16A.

Figures 7A, 7B, 7C:
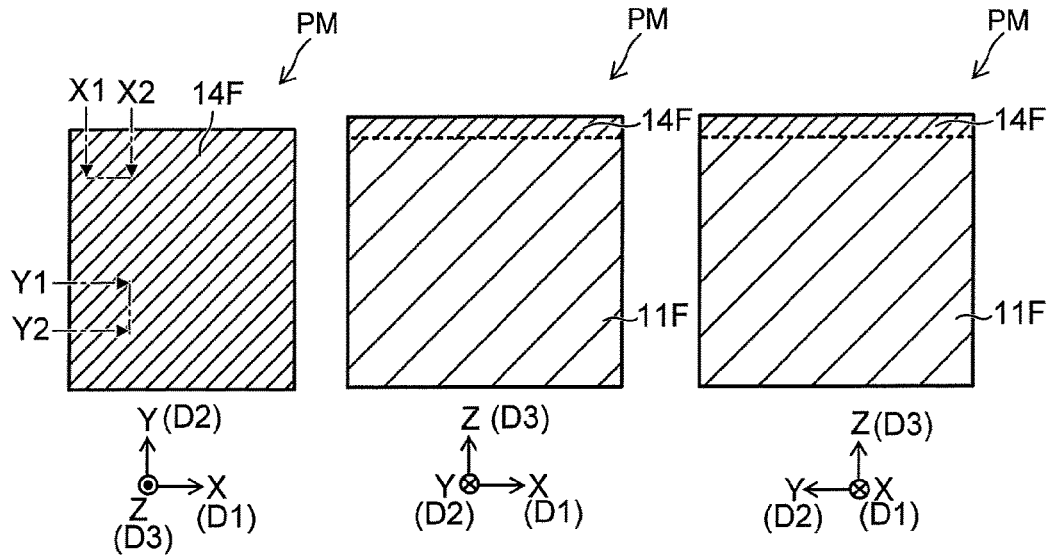
FIG. 7A to FIG. 7C are schematic views illustrating the method for manufacturing the semiconductor device according to the first embodiment.

A first semiconductor film 11F is provided as shown in FIG. 7A to FIG. 7C. For example, the first semiconductor film 11F is obtained by performing epitaxial growth on a not-illustrated substrate. The first semiconductor film 11F is used to form the first semiconductor region 11. The first semiconductor film 11F is of the first conductivity type. For example, a fourth semiconductor film 14F is formed in the upper portion of the first semiconductor film 11F. For example, an impurity of the first conductivity type is ion-implanted into the vicinity of the upper surface of the first semiconductor film 11F. Thereby, the fourth semiconductor film 14F is formed. A portion of the fourth semiconductor film 14F is used to form the fourth semiconductor region 14. These semiconductor regions include, for example, SiC.

The first semiconductor film 11F and the fourth semiconductor film 14F are included in a patterning body PM.

Figures 8A, 8B, 8C:
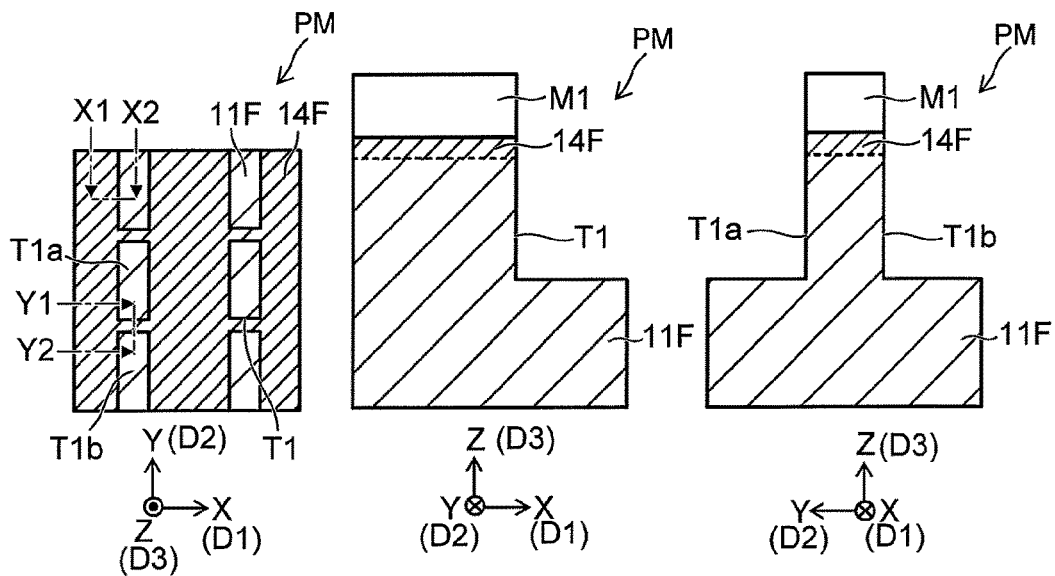
FIG. 8A to FIG. 8C are schematic views illustrating the method for manufacturing the semiconductor device according to the first embodiment.

As shown in FIG. 8A to FIG. 8C, a portion of the fourth semiconductor film 14F and a portion of the first semiconductor film 11F are removed using a first mask M1 having openings. Thereby, a first trench T1 is formed. The first trench T1 includes multiple portions (a first portion T1*a*, a second portion T1*b*, etc.). The multiple portions are arranged in the X-axis direction and the Y-axis direction. The direction that connects the first portion T1*a* and the second portion T1*b* is aligned with the Y-axis direction. A portion of the first portion T1*a* may be linked to a portion of the second portion T1*b*. For example, the first trench T1 is used as a source trench. The distance along the second direction D2 between two portions (the first portion T1*a* and the second portion T1*b*) of the first trench T1 is, for example, about 1 μm. The distance corresponds to the third width w3 (referring to FIG. 3).

Figures 9A, 9B, 9C:
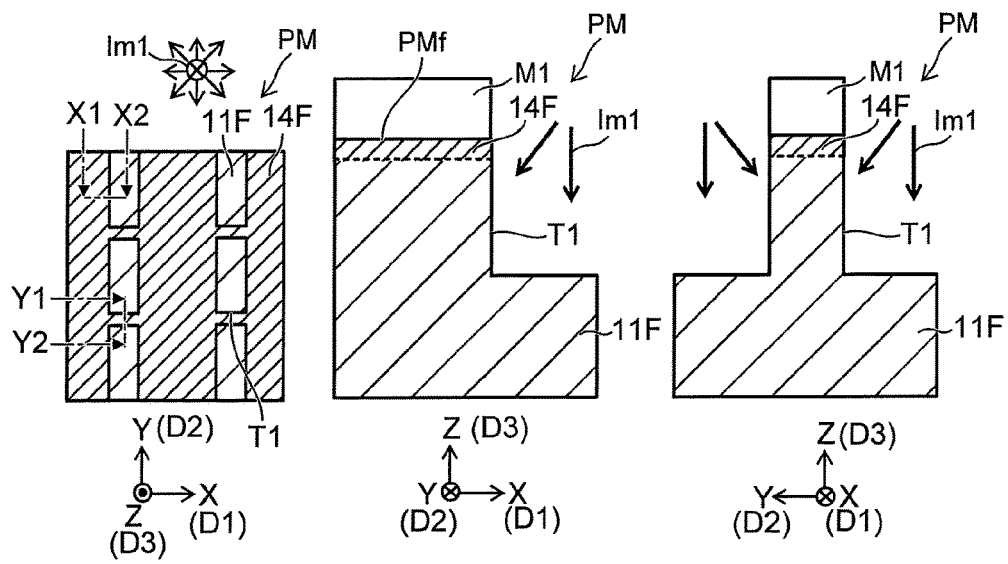
FIG. 9A to FIG. 9C are schematic views illustrating the method for manufacturing the semiconductor device according to the first embodiment.

Ion implantation of a first element Im1 is performed as shown in FIG. 9A to FIG. 9C. The ion implantation is performed from an oblique direction with respect to the Z-axis direction as an axis. For example, the ion implantation may be performed multiple times while modifying the direction of the ion implantation. The first element Im1 is an element used as the impurity of the second conductivity type. The first element Im1 includes, for example, Al.

Thus, the element (the first element Im1) of the second conductivity type is implanted from multiple directions tilted with respect to an upper surface PMf of the patterning body PM.

Figures 10A, 10B, 10C:
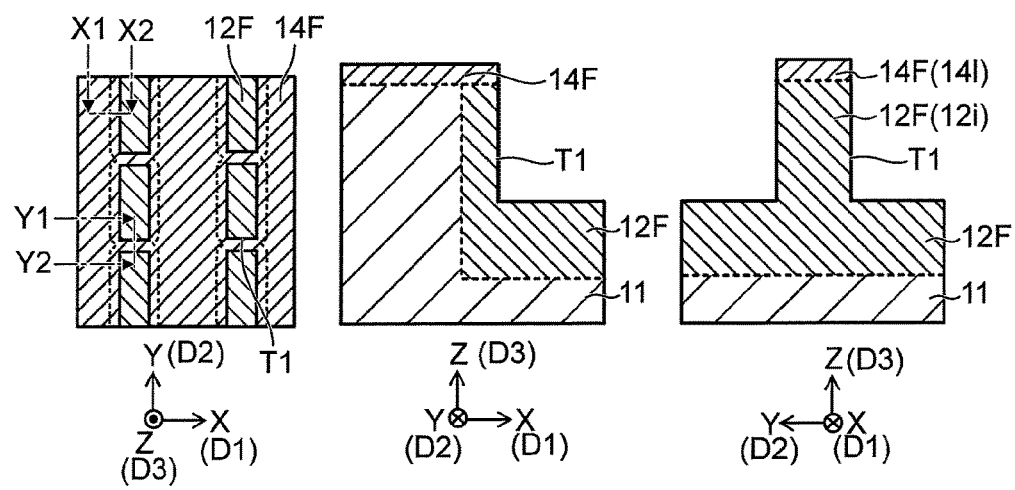
FIG. 10A to FIG. 10C are schematic views illustrating the method for manufacturing the semiconductor device according to the first embodiment.

The first mask M1 is removed as shown in FIG. 10A to FIG. 10C. A second semiconductor film 12F of the second conductivity type is formed by the ion implantation recited above. A region where the first element Im1 is substantially not implanted is used to form the first semiconductor region. A portion of the second semiconductor film 12F is used to form the ninth partial region 12*i*. The fourth semiconductor film 14F that is provided on the region used to form the ninth partial region 12*i* is used to form the twelfth partial region 14*l*.

Ion implantation of a second element Im2 is performed as shown in FIG. 11A to FIG. 11C. The second element Im2 is of the second conductivity type. The second element Im2 includes, for example, Al. The ion implantation is performed via the fourth semiconductor film 14F. The third semiconductor region 13 is formed by the ion implantation. The second semiconductor region 12 and the fourth semiconductor region 14 are formed.

A second trench T2 is formed as shown in FIG. 12A to FIG. 12C. The second trench T2 is, for example, a gate trench.

Figures 13A, 13B, 13C:
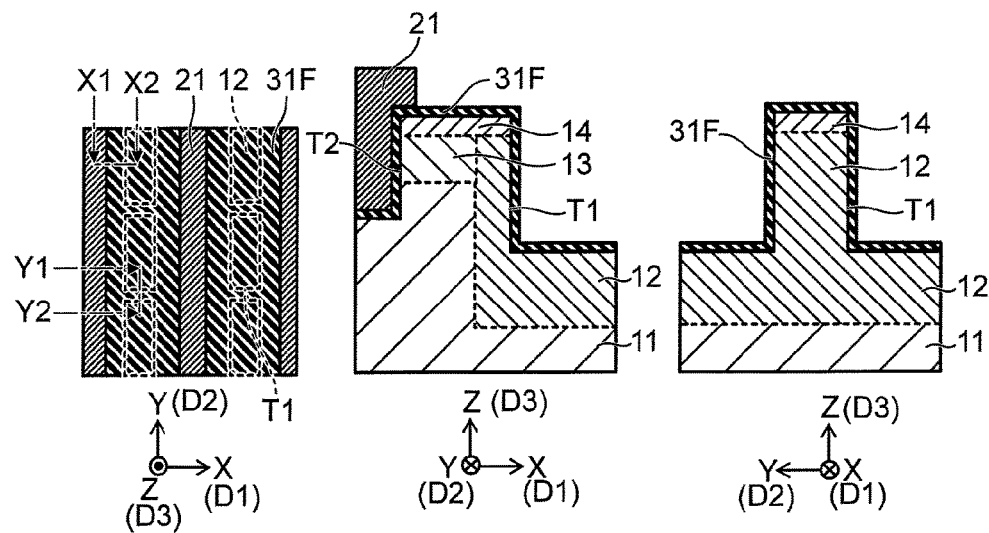
FIG. 13A to FIG. 13C are schematic views illustrating the method for manufacturing the semiconductor device according to the first embodiment.

As shown in FIG. 13A to FIG. 13C, an insulating film 31F is formed; further, the first electrode 21 is formed. As described below, the insulating film 31F is used to form the first insulating film 31. The first electrode 21 is, for example, polysilicon. The insulating film 31F (the first insulating film 31) includes, for example, silicon oxide.

Figures 14A, 14B, 14C:
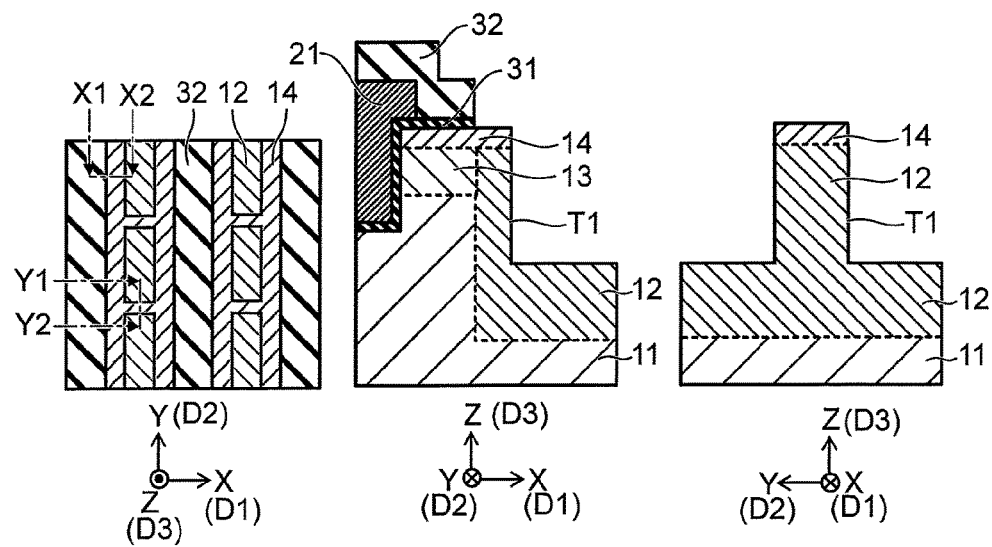
FIG. 14A to FIG. 14C are schematic views illustrating the method for manufacturing the semiconductor device according to the first embodiment.

The second insulating film 32 is formed as shown in FIG. 14A to FIG. 14C. A portion of the insulating film 31F is removed in the processing of a portion of the formation of the second insulating film 32. Thereby, the first insulating film 31 is formed. For example, the fourth semiconductor region 14, the second semiconductor region 12, etc., are exposed.

The first conductive film 22a is formed as shown in FIG. 15A to FIG. 15C.

The second conductive film 22b is formed as shown in FIG. 16A to FIG. 16C.

Thereby, the semiconductor device 111 is made.

Several examples of other semiconductor devices according to the embodiment will now be described. The portions that are different from those of the semiconductor device 110 are described in the description hereinbelow. Multiple conductive films (the first conductive film 22a, the second conductive film 22b, etc.) may be provided in the second electrode 22 in the semiconductor devices of the examples recited below as well.

FIG. 17 to FIG. 22 are schematic views illustrating other semiconductor devices according to the first embodiment.

These drawings correspond respectively to a line P1-P2 cross section of FIG. 1B.

Figure 17:
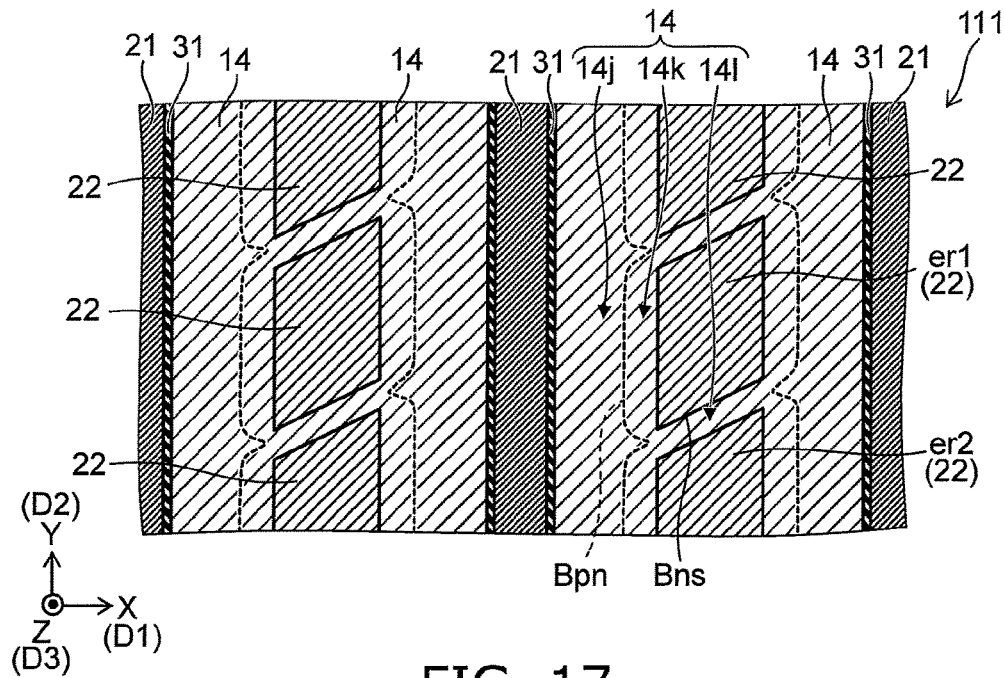
FIG. 17 is a schematic view illustrating other semiconductor devices according to the first embodiment.

In a semiconductor device 111 as shown in FIG. 17, a boundary Bns between the first electrode region er1 and the twelfth partial region 14*l* is tilted with respect to the first direction D1 and tilted with respect to the second direction D2.

Because the boundary Bns is tilted, for example, the number of the ion implantations from the oblique direction of the first element Im1 is reduced. For example, a semiconductor device having high productivity is obtained.

Figure 18:
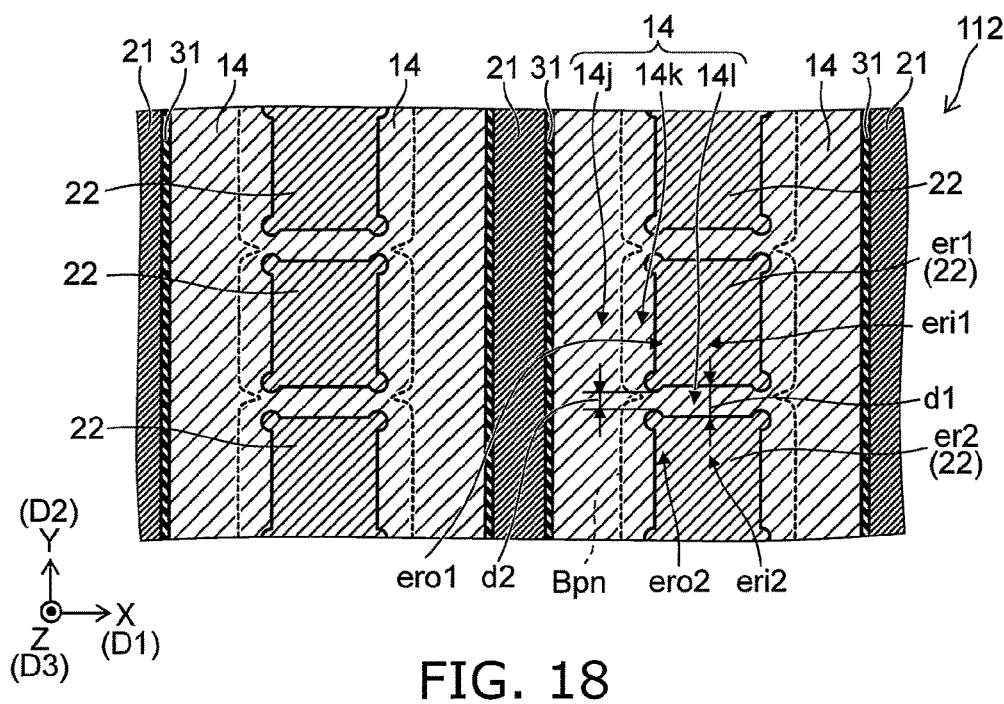
FIG. 18 is a schematic view illustrating other semiconductor devices according to the first embodiment.

In a semiconductor device 112 as shown in FIG. 18, protrusions are provided at the corners of the first electrode region er1 and the second electrode region er2. The distance along the second direction D2 between the protrusions is shorter than the distance along the second direction D2 between the regions other than the protrusions.

As shown in FIG. 18, the first electrode 21 extends along the second direction D2 (the Y-axis direction). The first electrode region er1 and the second electrode region er2 are separated from the first electrode 21 in the first direction D1 (the X-axis direction). The first electrode region er1 includes a first inner region eri1 and a first outer region ero1. The first outer region ero1 is positioned between the first inner region eri1 and the first electrode 21 in the first direction D1. The second electrode region er2 includes a second inner region eri2 and a second outer region ero2. The second outer region ero2 is positioned between the second inner region eri2 and the first electrode 21 in the first direction D1.

The distance along the second direction D2 between the first outer region ero1 and the second outer region ero2 is taken as a second distance d2. The distance along the second direction D2 between the first inner region eri1 and the second inner region eri2 is taken as a first distance d1. In the semiconductor device 112, the second distance d2 is shorter than the first distance d1.

By such a configuration, for example, the amount of the recess of the boundary Bpn (the boundary between the third partial region 11c and the seventh partial region 12g) can be small. Thereby, for example, a high effect of relaxing the electric field applied to the first insulating film 31 can be maintained.

Figure 19:
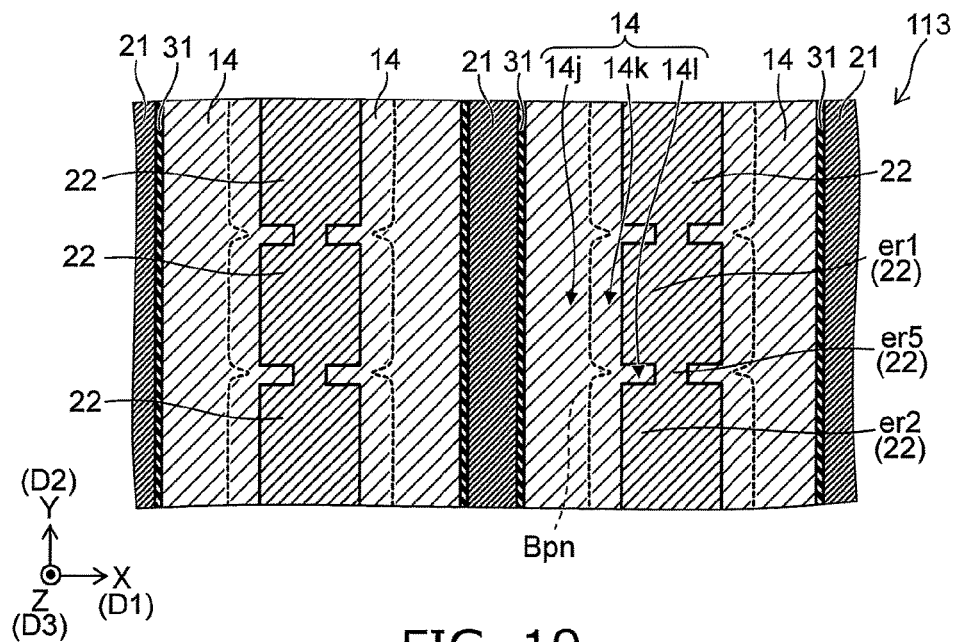
FIG. 19 is a schematic view illustrating other semiconductor devices according to the first embodiment.

In a semiconductor device 113 as shown in FIG. 19, a portion of the first electrode region er1 is linked to a portion of the second electrode region er2. For example, the second electrode 22 further includes a fifth electrode region er5. The fifth electrode region er5 is between a portion of the first electrode region er1 and a portion of the second electrode region er2 in the second direction D2 (the Y-axis direction). The fifth electrode region er5 connects the portion of the first electrode region er1 to the portion of the second electrode region er2.

In the example, the twelfth partial region 14*l* of the fourth semiconductor region 14 is provided between the first electrode region er1 and the second electrode region er2 at a portion where the fifth electrode region er5 is not provided.

Figure 20:
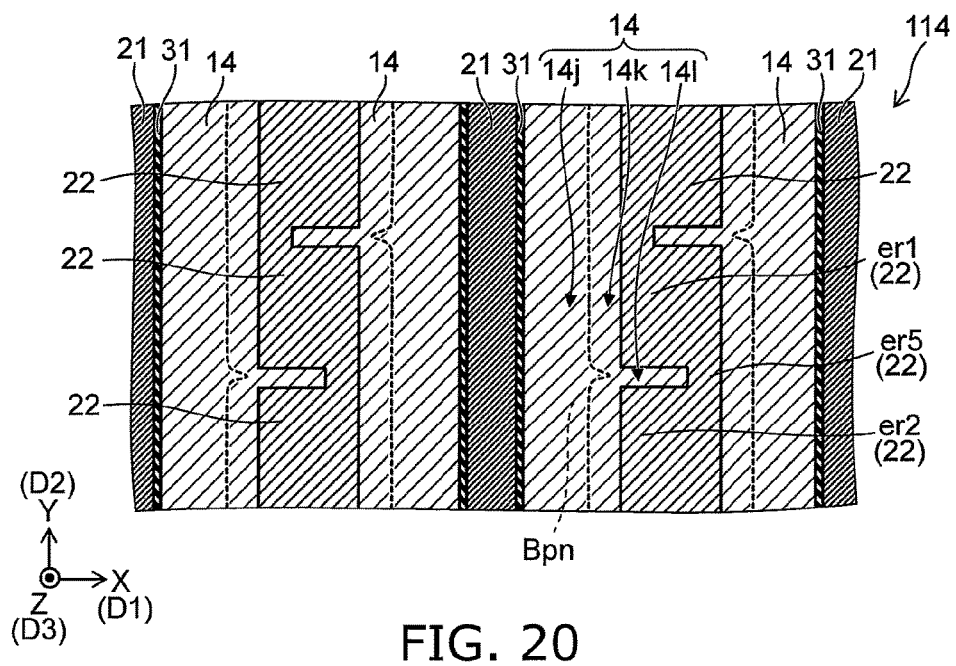
FIG. 20 is a schematic view illustrating other semiconductor devices according to the first embodiment.

As shown in FIG. 20, the fifth electrode region er5 is provided in a semiconductor device 114 as well.

Figure 21:
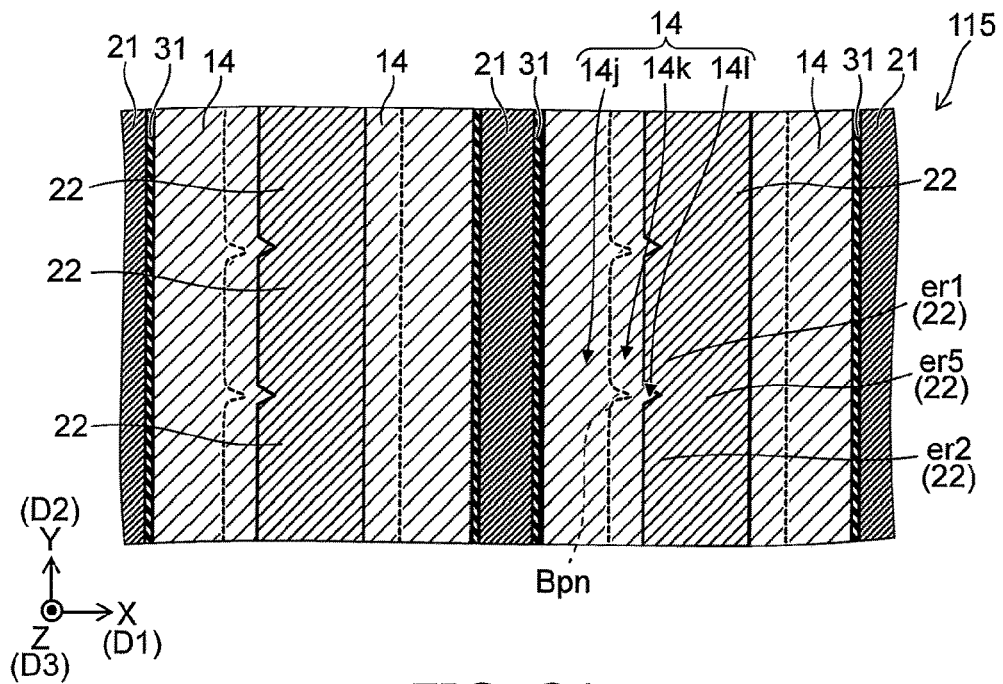
FIG. 21 is a schematic view illustrating other semiconductor devices according to the first embodiment.

As shown in FIG. 21, the fifth electrode region er5 is provided in a semiconductor device 115 as well. In the example, the twelfth partial region 14*l* is provided on the first electrode 21 side. In the example, a recess can be considered to be provided in a portion of the second electrode 22 having a band configuration. The twelfth partial region 14*l* is provided in the recess.

Figure 22:
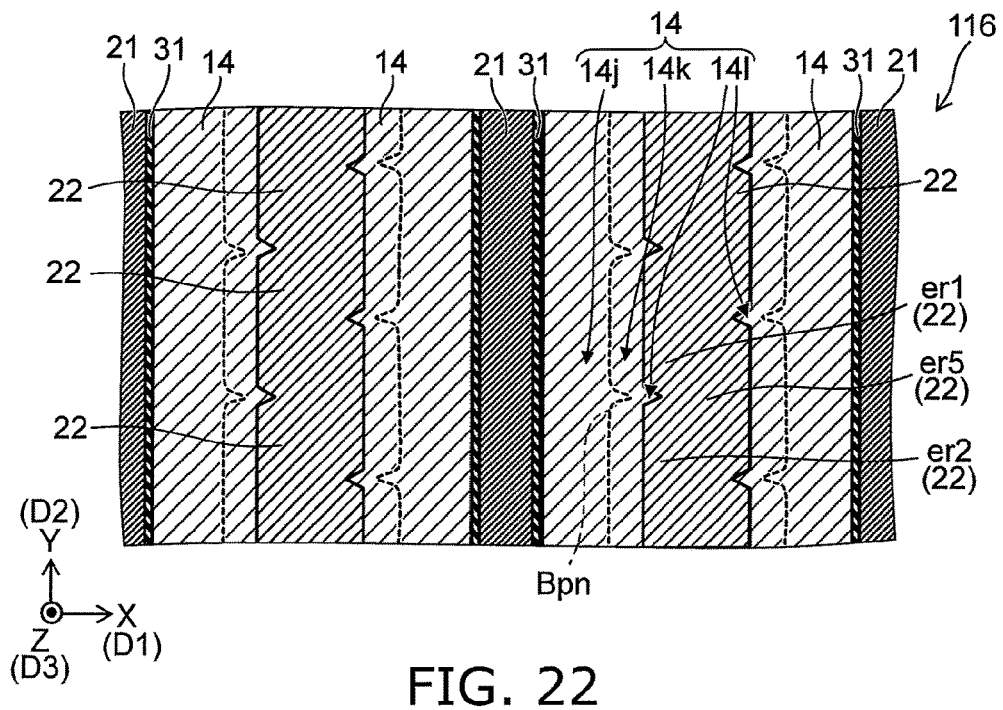
FIG. 22 is a schematic view illustrating other semiconductor devices according to the first embodiment.

As shown in FIG. 22, the fifth electrode region er5 is provided in a semiconductor device 116 as well. In the example, a recess can be considered to be provided in a portion of the second electrode 22 having a band configuration.

Recesses are provided on two sides of the second electrode 22 having the band configuration. The twelfth partial region 14*l* is provided in each of the recesses. The multiple recesses are provided alternately on the two sides of the second electrode 22 having the band configuration. The multiple twelfth partial regions 14*l* are provided alternately on the two sides of the second electrode 22.

The twelfth partial region 14*l* is provided in the semiconductor devices 111 to 116 as well. Thereby, for example, the contact resistance can be reduced. For example, a semiconductor device can be provided in which the on-resistance can be reduced.

Second Embodiment

The embodiment is related to a method for manufacturing a semiconductor device.

In the manufacturing method, for example, the first trench T1 that includes multiple portions is formed in the upper surface PMf of the patterning body PM (referring to FIG. 8A to FIG. 8C). The patterning body PM includes the first semiconductor film 11F of the first conductivity type. The multiple portions include, for example, the first portions T1a and T1b, etc.

The manufacturing method includes implanting an element of the second conductivity type after forming the first trench T1 (referring to FIG. 9A to FIG. 9C). The element of the second conductivity type includes, for example, the first element Im1. The implantation includes implanting the element into the patterning body PM from multiple directions tilted with respect to the upper surface PMf.

Thereby, as described in reference to FIG. 10A to FIG. 10C, a region that corresponds to the ninth partial region 12*i* of the second semiconductor region 12 and a portion that corresponds to the twelfth partial region 14*l* of the fourth semiconductor region 14 can be formed.

According to the manufacturing method according to the embodiment, a method for manufacturing a semiconductor device can be provided in which the on-resistance can be reduced.

According to the embodiments, a semiconductor device and a method for manufacturing the semiconductor device can be provided in which the on-resistance can be reduced.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between these multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, the second electrode including a first electrode region, a second electrode region, and a third electrode region, a first direction being from the first electrode toward the first electrode region and crossing a second direction, the second direction being from the first electrode region toward the second electrode region, a position of the third electrode region in the first direction being between a position of the first electrode region in the first direction and a position of the first electrode in the first direction;
a first semiconductor region of a first conductivity type, the first semiconductor region including a first partial region, a second partial region, a third partial region, a fourth partial region, and a fifth partial region, the first partial region being separated from the first electrode in a third direction, the third direction crossing the first direction and the second direction, the second partial region being separated from the first electrode region in the third direction, a position of the third partial region in the first direction being between a position of the first partial region in the first direction and a position of the second partial region in the first direction, at least a portion of the third partial region being between the first electrode and the first electrode region in the first direction, the fourth partial region being separated from the second electrode region in the third direction, the fifth partial region being between the second partial region and the fourth partial region;
a second semiconductor region of a second conductivity type, the second semiconductor region including a sixth partial region, a seventh partial region, an eighth partial region, and a ninth partial region, the sixth partial region being positioned between the second partial region and the first electrode region in the third direction, a portion of the seventh partial region being positioned between the first electrode region and the at least a portion of the third partial region in the first direction, the eighth partial region being positioned between the fourth partial region and the second electrode region in the third direction, at least a portion of the ninth partial region being positioned between the first electrode region and the second electrode region in the second direction;
a third semiconductor region of the second conductivity type, the third semiconductor region being connected to the second semiconductor region, the third semiconductor region being positioned between the third electrode region and the at least a portion of the third partial region in the third direction, the third semiconductor region being positioned between the first electrode and another portion of the seventh partial region in the first direction;
a fourth semiconductor region of the first conductivity type, the fourth semiconductor region being electrically connected to the second electrode, the fourth semiconductor region including a tenth partial region, an eleventh partial region, and a twelfth partial region, the tenth partial region being positioned between the third semiconductor region and a portion of the third electrode region in the third direction, the eleventh partial region being positioned between the seventh partial region and another portion of the third electrode region in the third direction, the twelfth partial region being positioned between the ninth partial region and the second electrode in the third direction; and
a first insulating film being provided between the first electrode and the first semiconductor region, between the first electrode and the third semiconductor region, and between the first electrode and the fourth semiconductor region.

2. The device according to claim 1, wherein the twelfth partial region contacts the first electrode region in the second direction, and contacts the second electrode region in the second direction.

3. The device according to claim 1, wherein the ninth partial region contacts the first electrode region in the second direction, and contacts the second electrode region in the second direction.

4. The device according to claim 1, wherein
the second electrode further includes a fourth electrode region,
a position of the fourth electrode region in the second direction is positioned between a position of the first electrode region in the second direction and a position of the second electrode region in the second direction, and
the twelfth partial region is positioned between the ninth partial region and the fourth electrode region.

5. The device according to claim 1, wherein a position in the third direction of a boundary between the sixth partial region and the first electrode region is positioned between a position in the third direction of the second partial region and a position in the third direction of a boundary between the first partial region and the first insulating film.

6. The device according to claim 1, wherein a boundary between the first electrode region and the twelfth partial region is tilted with respect to the first direction and tilted with respect to the second direction.

7. The device according to claim 1, wherein the first semiconductor region, the second semiconductor region, the third semiconductor region, and the fourth semiconductor region include silicon carbide.

8. The device according to claim 1, wherein the second electrode region is electrically connected to the first electrode region.

9. The device according to claim 1, wherein at least a portion of the sixth partial region does not overlap the first insulating film in the first direction.

10. The device according to claim 1, further comprising a third electrode,
the first semiconductor region being positioned between the third electrode and the first electrode in the third direction and between the third electrode and the second electrode in the third direction,
a distance along the third direction between the third electrode and the sixth partial region being shorter than a distance along the third direction between the third electrode and the first insulating film.

11. The device according to claim 1, wherein a difference between a first concentration and a second concentration is larger than a difference between a third concentration and a fourth concentration, the first concentration being of an impurity of the second conductivity type in the second semiconductor region, the second concentration being of an impurity of the first conductivity type in the second semiconductor region, the third concentration being of the impurity of the second conductivity type in the third semiconductor region, the fourth concentration being of the impurity of the first conductivity type in the third semiconductor region.

12. The device according to claim 1, wherein a difference between a fifth concentration and a sixth concentration is larger than a difference between a seventh concentration and an eighth concentration, the fifth concentration being of an impurity of the first conductivity type in the fourth semiconductor region, the sixth concentration being of an impurity of the second conductivity type in the fourth semiconductor region, the seventh concentration being of the impurity of the first conductivity type in the first semiconductor region, the eighth concentration being of the impurity of the second conductivity type in the first semiconductor region.

13. The device according to claim 1, wherein
the first electrode region does not overlap the twelfth partial region in the third direction, and
the second electrode region does not overlap the twelfth partial region in the third direction.

14. The device according to claim 1, wherein
the first electrode extends along the second direction, and
the second electrode region is separated from the first electrode in the first direction.

15. The device according to claim 1, wherein
the first electrode extends along the second direction,
the second electrode region is separated from the first electrode in the first direction,
the first electrode region includes:
a first inner region; and
a first outer region positioned between the first inner region and the first electrode in the first direction,
the second electrode region includes:
a second inner region; and
a second outer region positioned between the second inner region and the first electrode in the first direction, and
a distance along the second direction between the first outer region and the second outer region is shorter than a distance along the second direction between the first inner region and the second inner region.

16. The device according to claim 1, wherein
the second electrode further includes a fifth electrode region,
the fifth electrode region is between a portion of the first electrode region and a portion of the second electrode region in the second direction, and
the fifth electrode region connects the portion of the first electrode region to the portion of the second electrode region.

17. The device according to claim 16, wherein the second direction and the third direction are along an m-plane of a silicon carbide.

18. The device according to claim 1, further comprising a second insulating film,
the second electrode further including a portion overlapping the first electrode in the third direction,
the second insulating film being positioned between the first electrode and the portion of the second electrode in the third direction.

* * * * *